(12) United States Patent
Wu et al.

(10) Patent No.: US 7,486,523 B2
(45) Date of Patent: Feb. 3, 2009

(54) FIXING MECHANISM FOR QUICK RELEASE CARD

(75) Inventors: Chin-Yi Wu, Taiping (TW); Yin-Lung Chang, Hsinchu (TW)

(73) Assignee: Accton Technology Corporation, Hsinchu (TW)

( * ) Notice: Subject to any disclaimer, the term of this patent is extended or adjusted under 35 U.S.C. 154(b) by 37 days.

(21) Appl. No.: 11/285,040

(22) Filed: Nov. 23, 2005

(65) Prior Publication Data

US 2007/0115646 A1 May 24, 2007

(51) Int. Cl.
*H05K 7/12* (2006.01)
(52) U.S. Cl. .................. 361/747; 361/740; 361/759; 361/801; 439/326
(58) Field of Classification Search .......... 361/801, 361/736, 807, 740, 747, 759; 439/326, 328; 409/326
See application file for complete search history.

(56) References Cited

U.S. PATENT DOCUMENTS

| | | | | |
|---|---|---|---|---|
| 6,164,998 A * | 12/2000 | Poi et al. | ............. | 439/326 |
| 6,270,369 B1 * | 8/2001 | Kato et al. | ............. | 439/326 |
| 6,424,542 B1 * | 7/2002 | Benson | ............. | 361/798 |
| 6,866,530 B1 * | 3/2005 | Yen-Lin | ............. | 439/326 |
| 6,926,549 B2 * | 8/2005 | Wang | ............. | 439/326 |
| 6,971,899 B1 * | 12/2005 | Liu | ............. | 439/326 |
| 7,021,953 B2 * | 4/2006 | Kawamae | ............. | 439/326 |
| 7,077,678 B1 * | 7/2006 | Korsunsky et al. | ............. | 439/326 |
| 7,134,895 B1 * | 11/2006 | Choy et al. | ............. | 439/326 |
| 7,241,159 B1 * | 7/2007 | Chen | ............. | 439/326 |
| 7,393,230 B2 * | 7/2008 | Yang et al. | ............. | 439/326 |
| 7,422,461 B2 * | 9/2008 | Chen | ............. | 439/326 |
| 7,427,208 B2 * | 9/2008 | Yang et al. | ............. | 439/326 |

* cited by examiner

*Primary Examiner*—Jeremy C Norris
*Assistant Examiner*—Dameon E Levi
(74) *Attorney, Agent, or Firm*—Rosenberg, Klein & Lee

(57) ABSTRACT

A fixing mechanism for quick release card is disclosed. The fixing mechanism consists of a main body, at least one fixing member and at least one locating element. The main body is an elastic body with the fixing member arranged on one end thereof. The fixing member can be arranged above a fixing hole on a motherboard with expansion slots for mini peripherals while the locating element is disposed on inner side of the main body. After a Mini-PCI card being disposed into a corresponding slot, the locating element locates the card so that the card is disposed firmly on the motherboard. Thus malfunction of the card due to falling of the card caused by external forces after being assembled is avoided.

15 Claims, 10 Drawing Sheets

FIXING MECHANISM FOR QUICK RELEASE CARD

BACKGROUND OF THE INVENTION

The present invention relates to a fixing mechanism, especially to a fixing mechanism for quick release card that is applied to fix Mini Peripheral Component Interconnect (Mini-PCI) card.

Due to the dramatic development of computer technology, the Peripheral Component Interconnect (PCI) transmission technology is improved day by day, with higher speed and more compact volume. For example, the Mini Peripheral Component Interconnect (Mini-PCI) inside the notebook is a compact and light card that has attracted a lot of users.

Refer to FIG. 1, a conventional Mini-PCI card is mounted inside a Mini-PCI slot. As shown in figure, a Mini-PCI card 10 is disposed inside a socket 20. Spring blades 25 arranged on two ends of one side of the socket 20 lock into slots (grooves) 15 on two sides of the card 10. By the elasticity of the spring blades 25, the card 10 is located on the socket 20.

In order to prevent the separation of the slot 15 and the spring blades 25, falling of the card 10 caused by external forces, poor contact between the card 10 and the socket 20 or even damage of the card 10 or the socket 20, a fixing plate 30 is arranged above the card 10 with reference of FIG 2. The fixing plate 30 is disposed on a motherboard 40 by screws 35 fastened into tapped holes 45. Thus the card 10 is mounted into the socket 20 more stably.

However, when users want to change the card 10, they need to take off the screws 35 of the fixing plate 30. If users change the card 10 frequently, the removal of screws is repeated. If the fixing plate 30 is not arranged properly, or the card 10 contacts the motherboard 40 caused by distortion of the fixing plate 30, short circuits between the card 10 and the motherboard 40 will lead to damages of the card 10 and the motherboard 40. For convenience of users, the disposition of the card 10 onto the socket 20 needs to be more stably, the assembling needs to be simplified, and the contact between the card 10 and the motherboard 40 needs to be avoided.

Therefore, a fixing mechanism for quick release card that makes the disposition of the card more stable and fixed the card inside the socket without screws is disclosed. Thus the loosening of the card caused by external forces is avoided and damages of the card as well as socket are reduced.

SUMMARY OF THE INVENTION

Therefore it is a primary object of the present invention to provide a fixing mechanism for quick release card that prevents falling as well as malfunction of the card after the Mini-PCI card being plugged into the corresponding slot. Thus the card is disposed inside the Mini-PCI slot more quickly and stably.

It is another object of the present invention to provide a fixing mechanism for quick release card that users only need to apply force on the pulling member for releasing the Mini-PCI card. This make users more convenient.

It is a further object of the present invention to provide a fixing mechanism for quick release card that supports the card by a supporting member so as to avoid malfunction of the card and the motherboard caused by short circuits due to contact between the card and the motherboard.

In order to achieve above objects, the present invention provides a fixing mechanism for quick release card consisting of an elastic main body, a fixing member on one end of the main body and a locating element on inner side of the main body. The present invention is applied to a motherboard with a Mini-PCI slot. The assembling way is that: by the fixing mechanism, the fixing mechanism is disposed above a fixing hole on the motherboard. Then plug the Mini-PCI card into the corresponding slot and locate the card by the locating element. Thus the card is located firmly on the motherboard so as to avoid malfunction of the card caused by falling of the card after being disposed. Moreover, a supporting member is arranged on the main body to avoid malfunction of the card and the motherboard caused by short circuits due to contact between the card and the motherboard.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
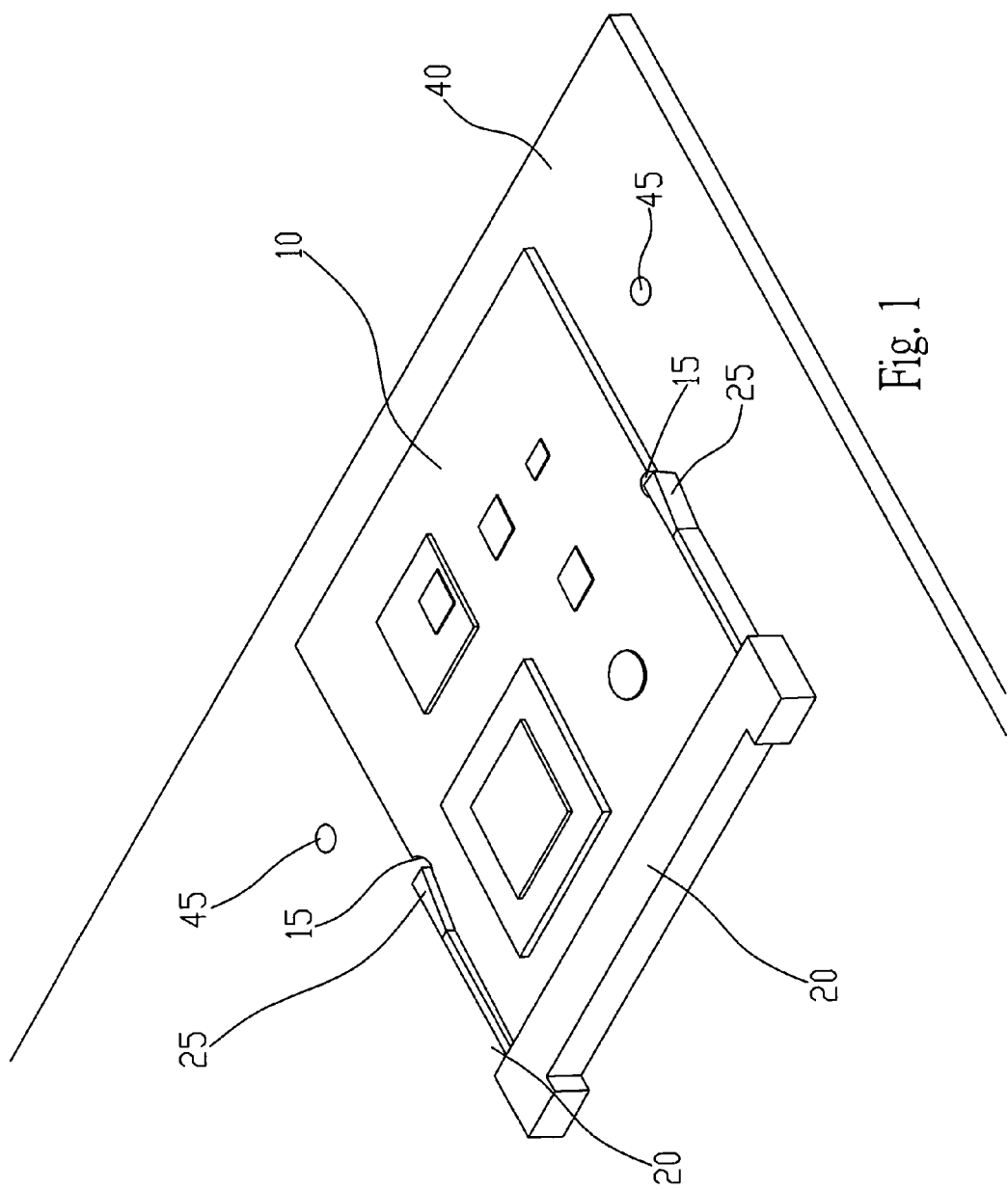
FIG. 1 is perspective view of a conventional Mini-PCI card disposed inside a Mini-PCI socket.
Figure 2:
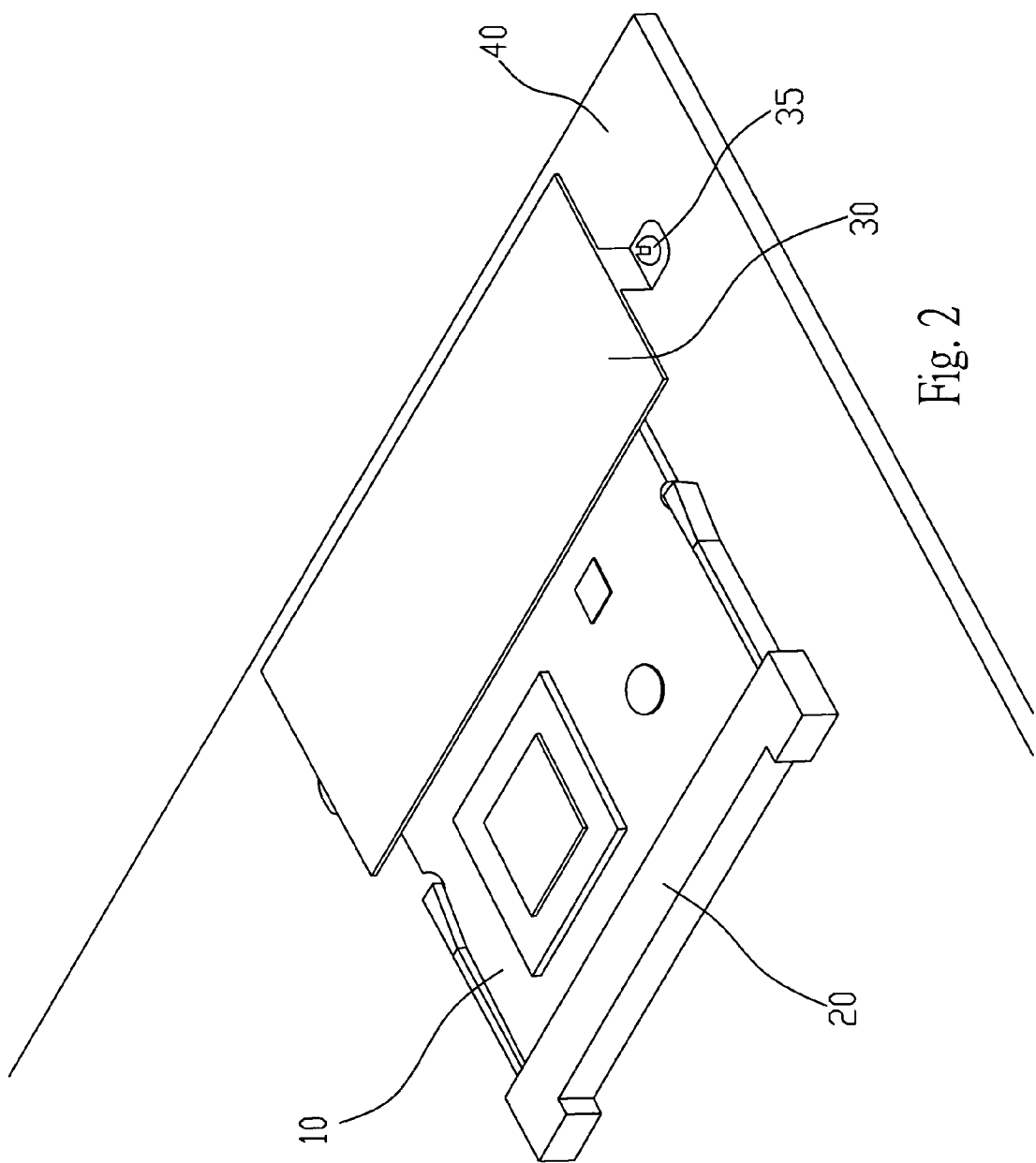
FIG. 2 is a perspective view of a fixing plate for fastening the conventional Mini-PCI card.
Figure 3:
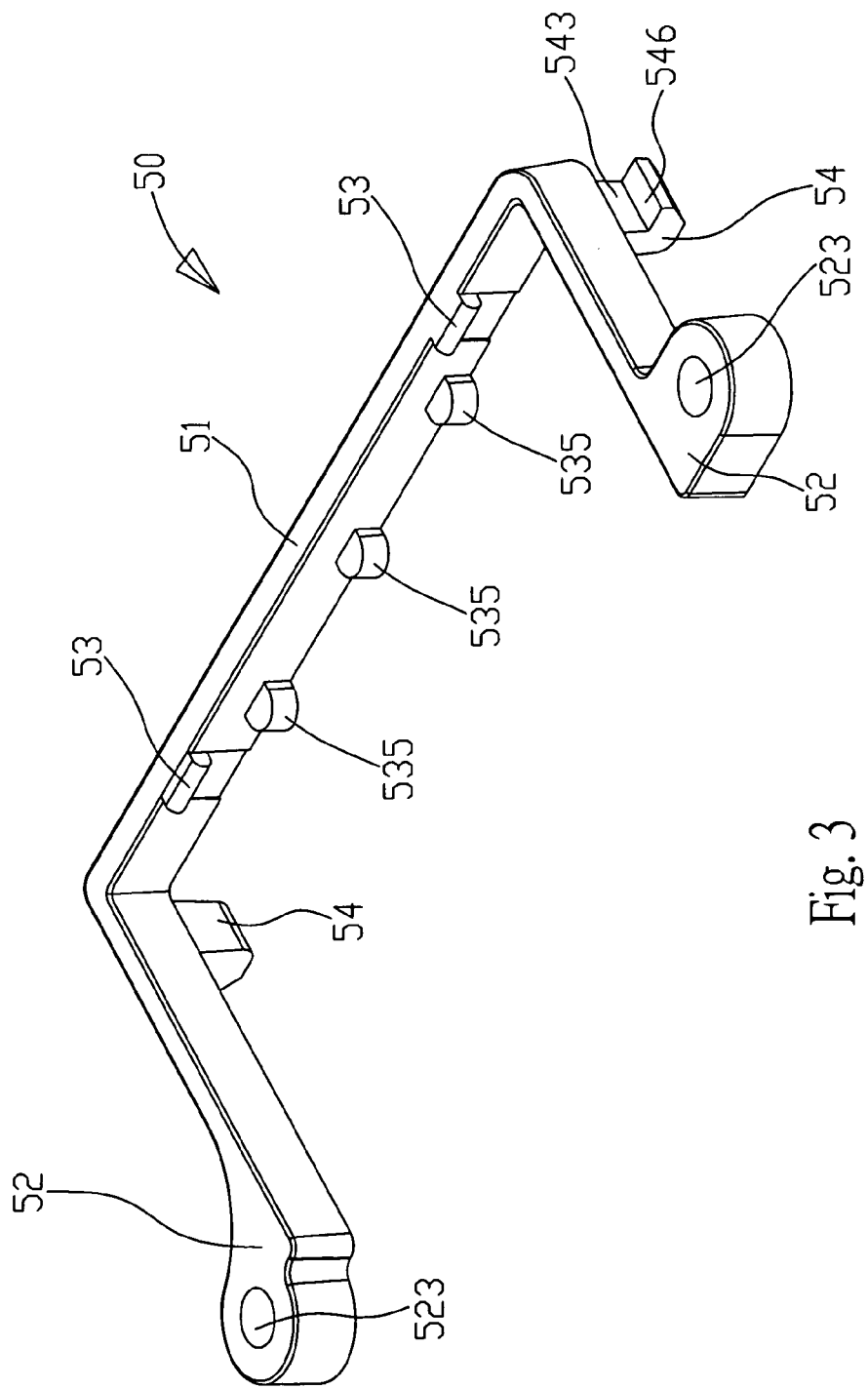
FIG. 3 is a perspective view of a fixing mechanism in accordance with the present invention.
Figure 4:
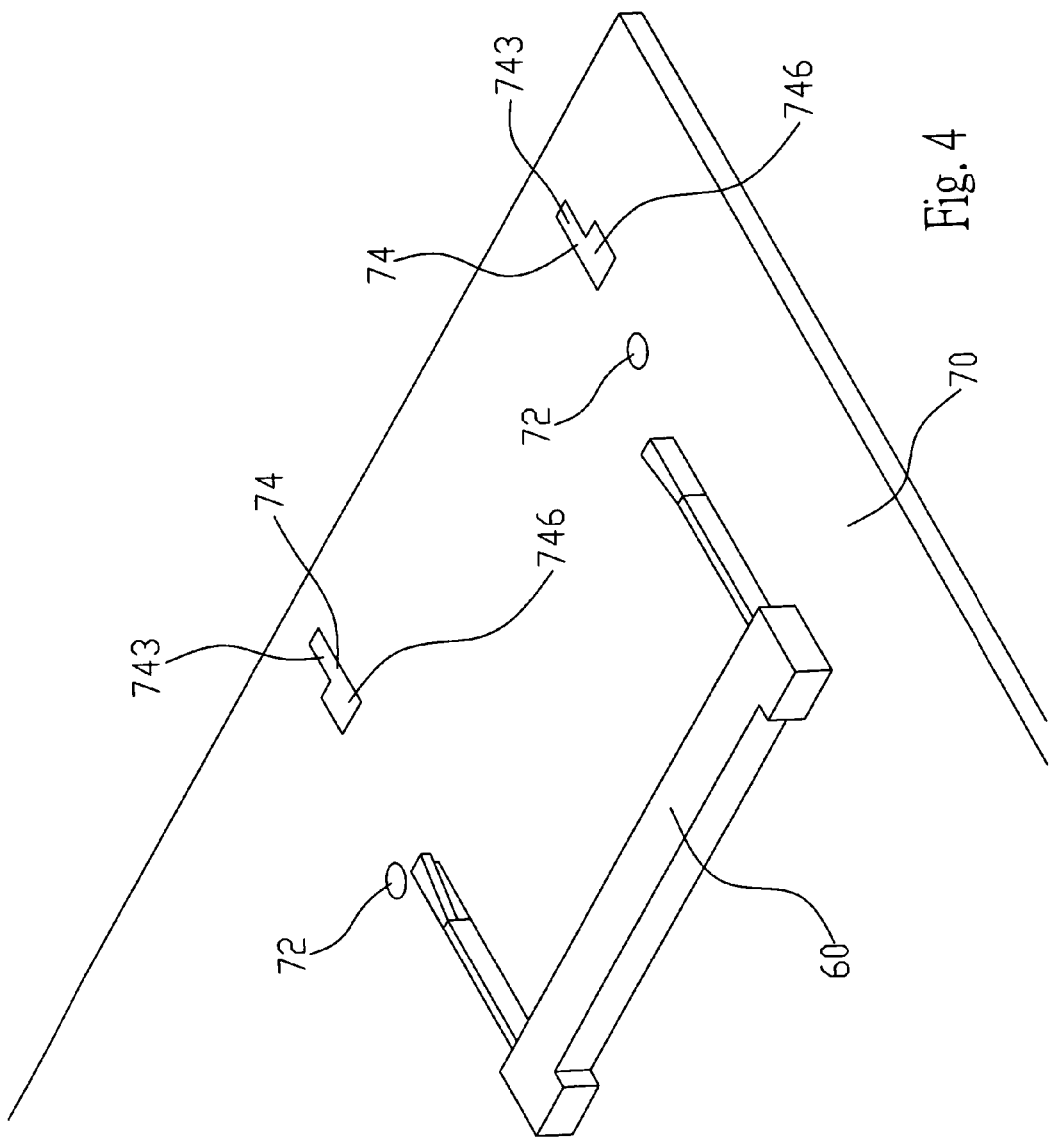
FIG. 4 is a perspective view showing a slot of an embodiment according to the present invention disposed on a motherboard.

Refer to FIG. 3 & FIG. 4, the fixing mechanism 50 in accordance with the present invention is applied to a motherboard 70 with a Mini-PCI slot 60. The fixing mechanism 50 is composed of a main body 51, at least a fixing member 52, and at least one locating element 53. The fixing member 52 for disposition on the motherboard 70 is installed on one end of the main body 51 while the locating element 53 is disposed on inner side of the main body 51.

The main body 51 is an elastic body made from plastic or other elastic material. The fixing member 52 is made from plastic material. The main body 51 and the fixing member 52 can be integrated with each other for the convenience of manufacturing the positioning mechanism 50. The locating element 53 can also be made from plastic material. For conveniently manufacturing the positioning mechanism 50, the main body 51 and the locating element 53 can be integrated with each other or the fixing member 52 and the locating element 53 integrated with each other. Even more, the main body 51, the fixing member 52 and the locating element 53 are integrated into one part.

At least one supporting member 535 is disposed on one side of the main body 51 while the supporting member 535 and the locating element 53 are on the same side. That is the supporting member 535 is on inner side of the main body 51 and under the locating element 53. At least one locking member 54 is disposed on two ends of the main body 51 respectively. The locking member 54 can be L-shaped and can be integrated into the main body 51. The locking member 54 consists of a connecting part 543 and a fastening part 546. The connecting part 543 connects the main body 51 with the fastening part 546. At least a locking slot 74 is mounted on the motherboard 70. The locking slot 74 can be L-shaped and having a first accommodating slot 743 and a second accommodating slot 746. The fastening part 546 inserts into the locking slot 74 and locks on the motherboard 70 while the connecting part 543 is mounted into the second accommodating slot 746 so as to make the locking member 54 fasten with the locking slot 74. Thus the fixing mechanism 50 is disposed firmly on the motherboard 70.

Figure 5:
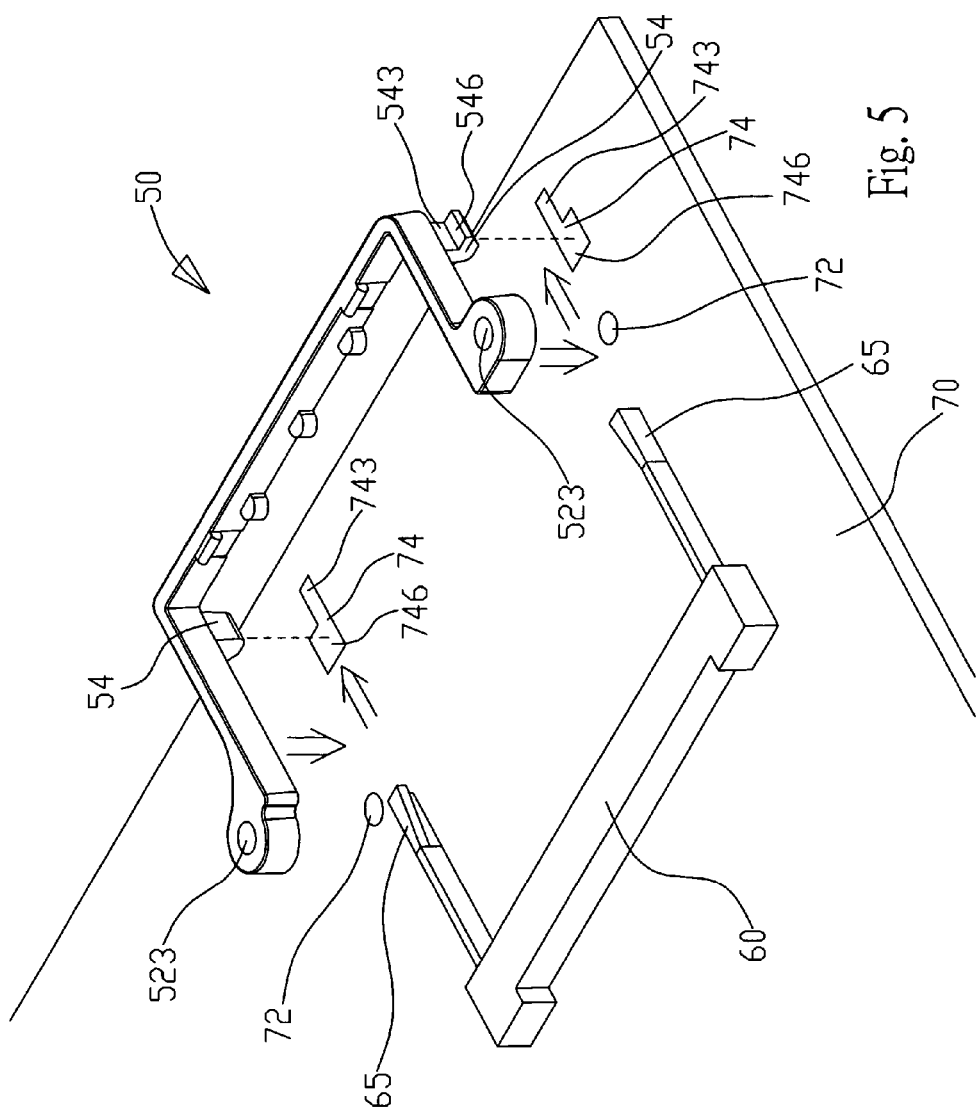
FIG. 5 is a schematic drawing showing the assembling of the present invention.
Figure 6:
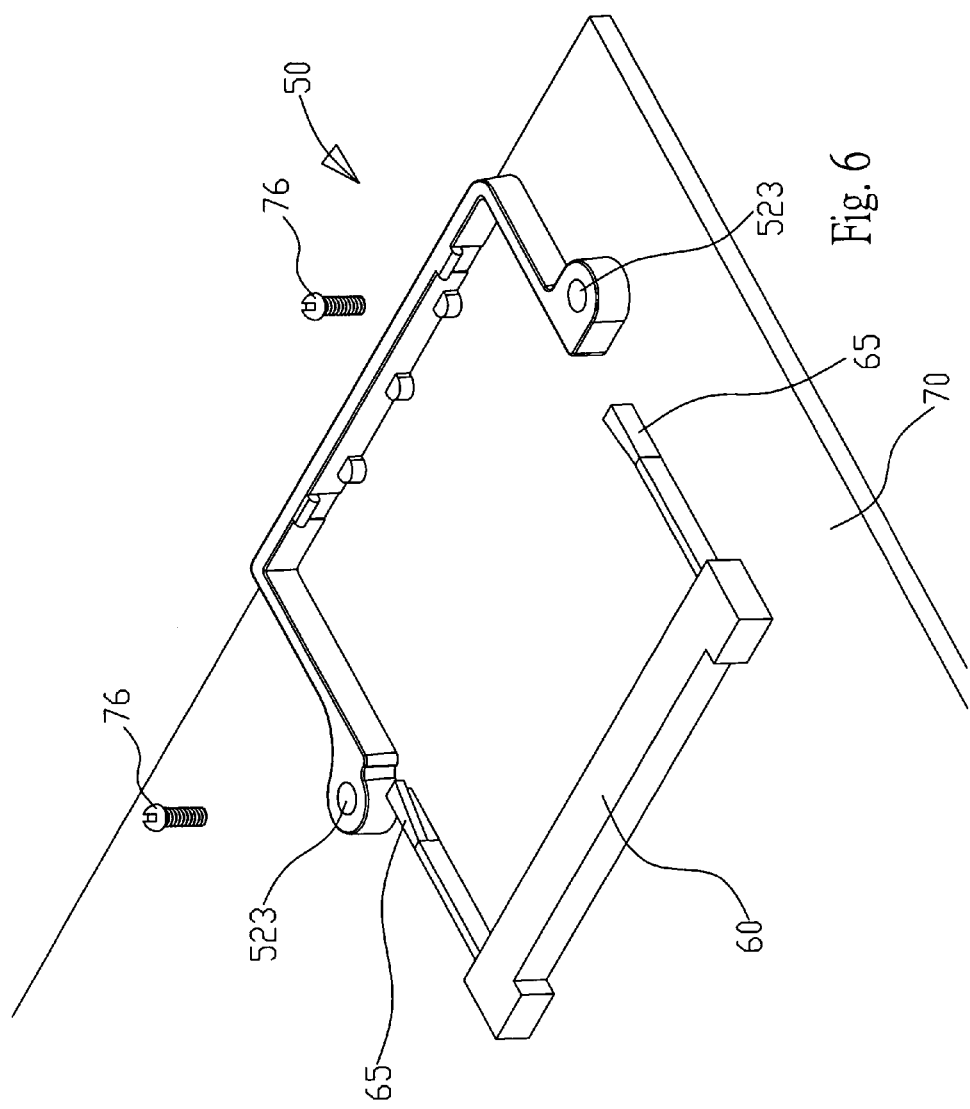
FIG. 6 is a schematic drawing showing the assembling of the present invention.

With reference of FIG. 5, while assembling the fixing mechanism 50 with the motherboard 70, the locking member 54 of the fixing mechanism 50 is aligned with the locking slot 74. The fastening part 546 of the locking member 54 aims at the first accommodating slot 743 of the locking slot 74 and move down the fixing mechanism 50 so as to make the fastening part 546 be mounted into the first accommodating slot 743. Then push the fixing mechanism 50 forward so that the connecting part 543 is mounted into the second accommodating slot 746 and the fastening part 546 fastens on the motherboard 70. Thus an insertion hole 523 is also aligned with a fixing hole 72. After the locking member 54 being fastened on the motherboard 70, as shown in FIG. 6, insert a screw 76 through the insertion hole 523 and then thread as well as fix the screw 76 into the fixing hole 72. Therefore, the fixing mechanism 50 is disposed firmly on the motherboard 70.

Figure 7:
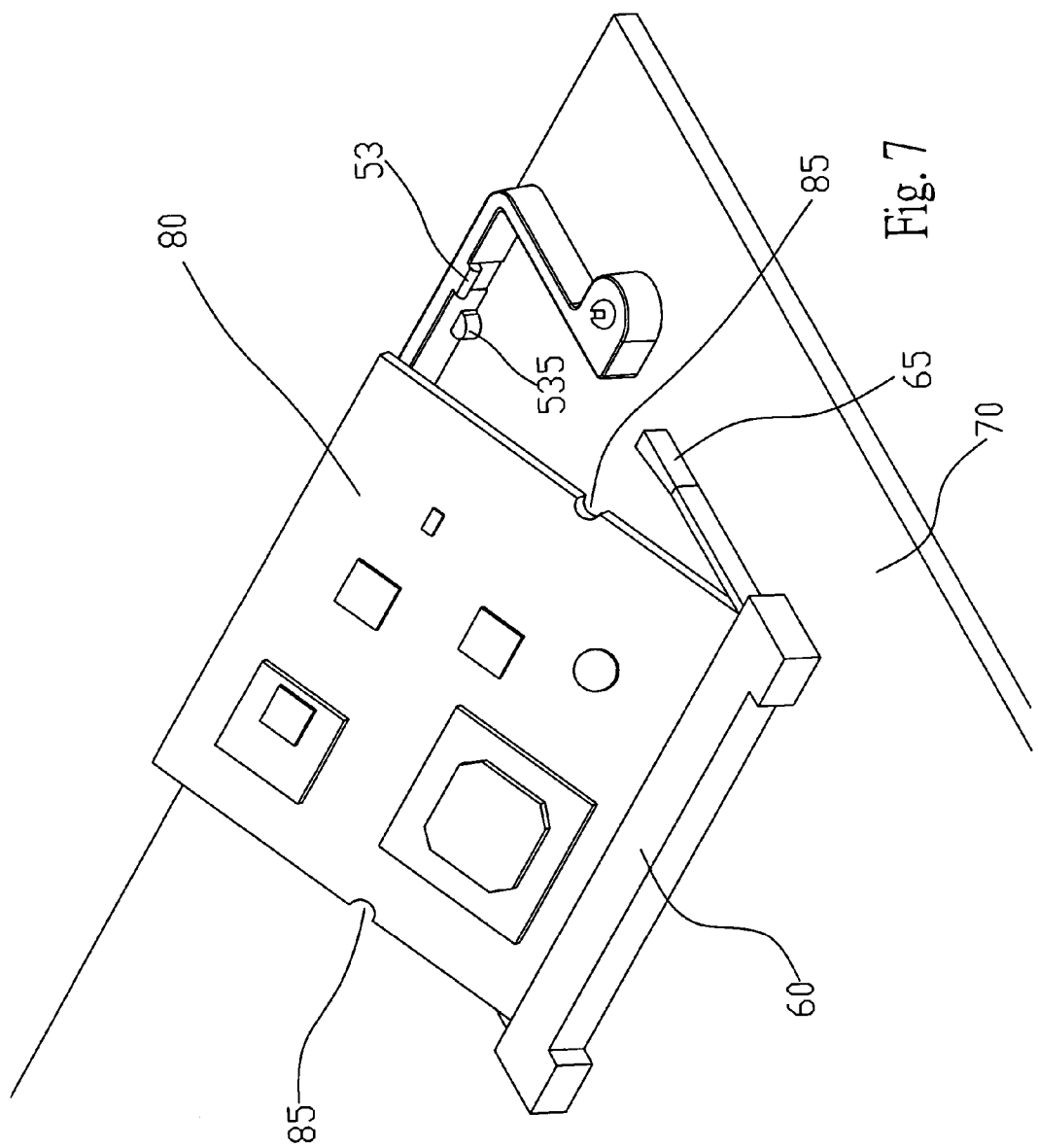
FIG. 7 is a schematic drawing showing the card of the present invention being assembled with the slot.
Figure 8:
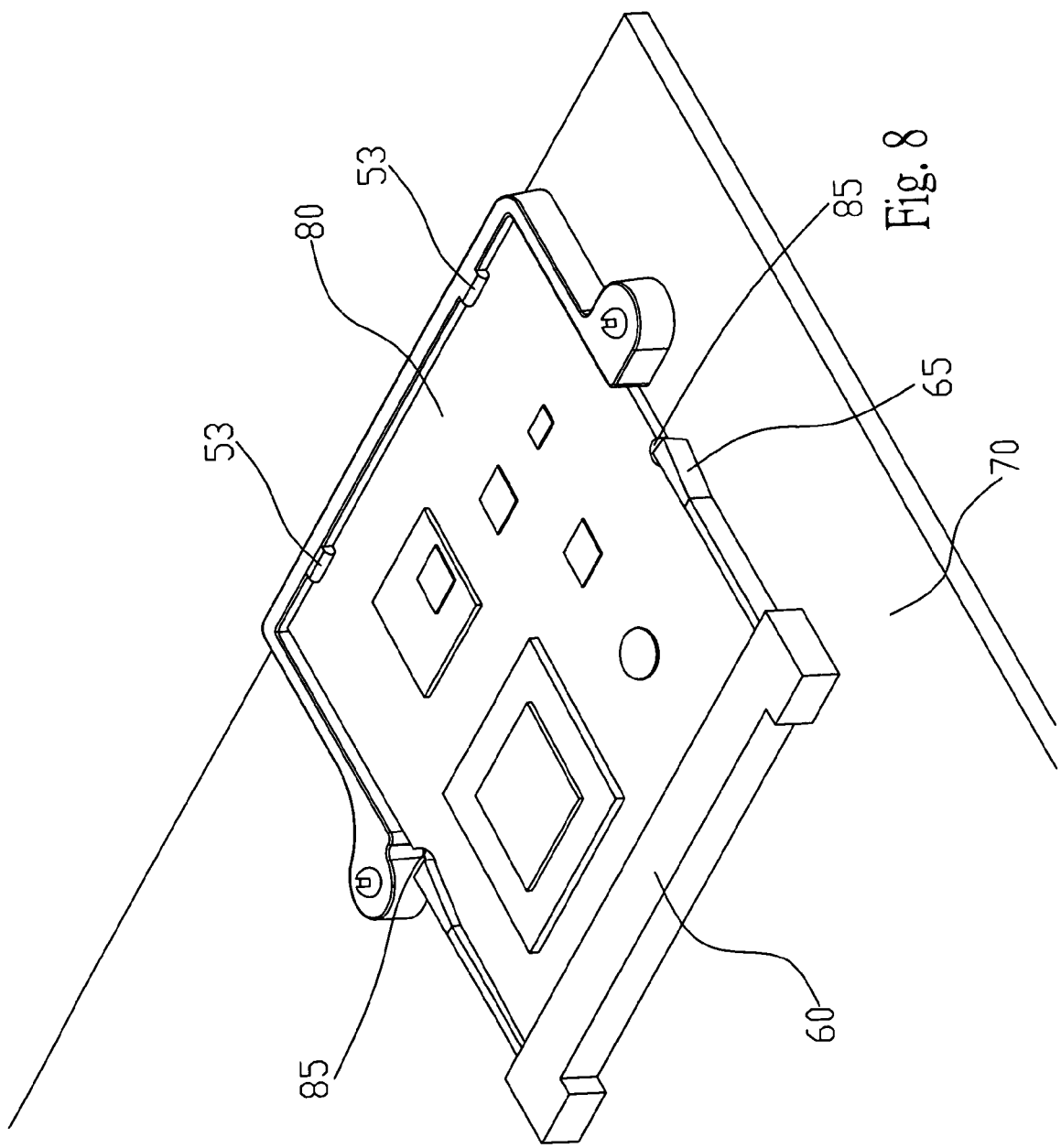
FIG. 8 is a schematic drawing showing the card of the present invention being assembled with the slot.

Refer to FIG. 7 & FIG. 8, while inserting an card 80 into a slot 60, the fixing mechanism 50 is applied to locate an card 80. Firstly, the card 80 is inclined at an angle and then is mounted into the slot 60. Later, raise spring blades 65 on two ends of one side of the slot 60 outwards so as to press down and plug the card 80 into the slot 60 smoothly. Next release the spring blades 65 so that the spring blades 65 lock into slots 85 on two sides of the card 80.

When pressing down the card 80, one side of the card 80 contacts the locating element 53. By being pressed, one side of the card 80 slides into the position between the locating element 53 and the supporting member 535 so that the locating element 53 leans against the card 80 and the locating element 53 locates the card 80. The supporting member 535 is used to support the card 80 for preventing short circuits caused by the contact between elements or circuit on the card 80 and the motherboard 70 when dispose the card 80 into the slot 60. Thus the card 80 or the motherboard 70 won't get damage caused by short circuits. As shown in FIG. 8, the card 80 is fastened firmly on the slot 60 by the locating element 53 and the spring blades 65.

When users want to plug out the card 80, at first, pull the main body 51 to make the locating element 53 move forward and the card 80 is above the locating element 53. In the meantime, pull the spring blades 65 on two ends of one side of the slot 60 outwards and tilt the card 80 upwards so that the card 80 is released. Finally, move the card 80 out of the slot 60.

Figure 9:
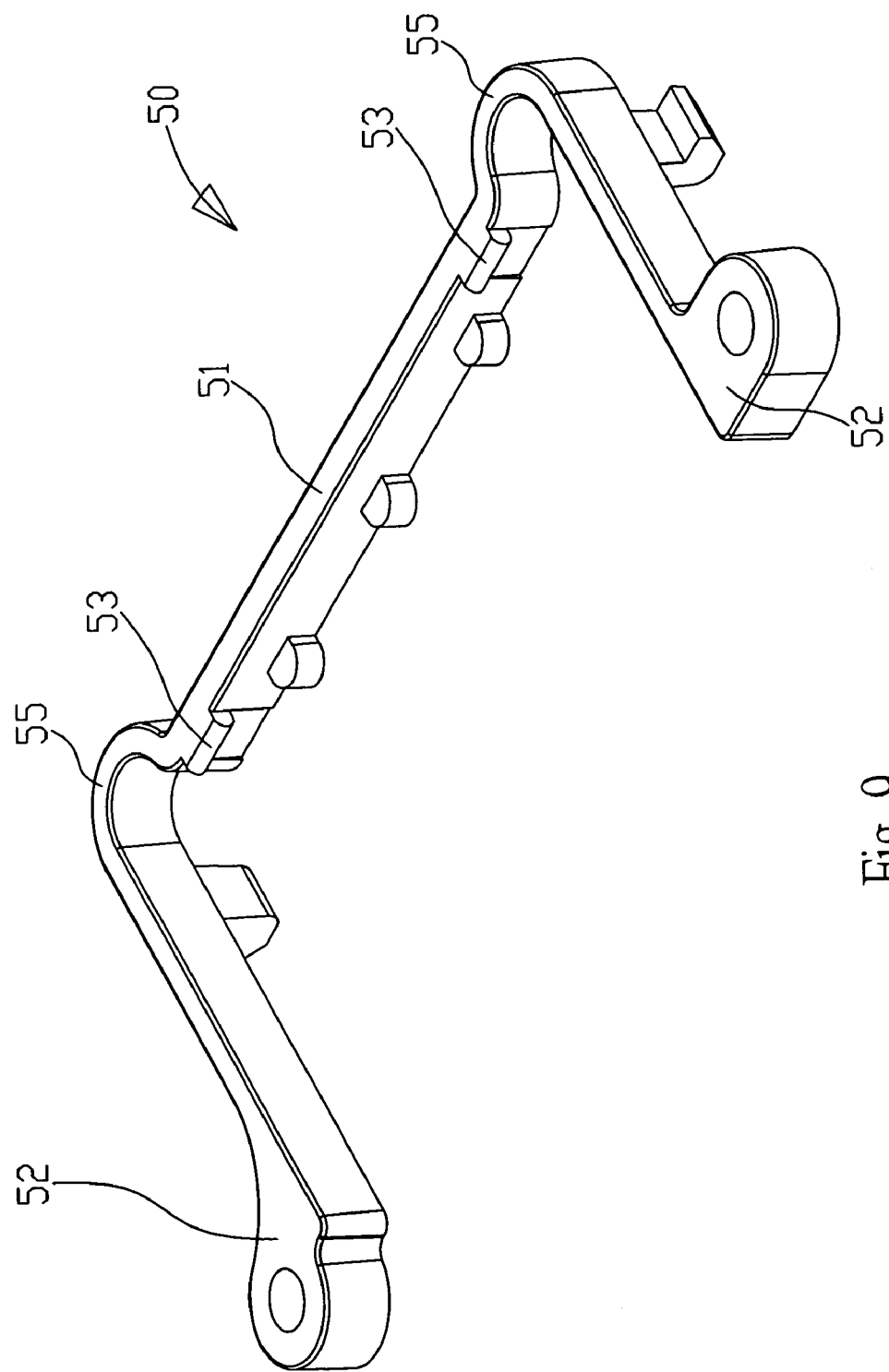
FIG. 9 is a perspective view of a fixing mechanism of another embodiment in accordance with the present invention.

Refer to FIG. 9, in order to be more labor saving in pulling the locating element 53 for moving the card 80 out of the socket more conveniently, at least one pulling member 55 is disposed between the main body 51 and the fixing member 52, in position next to the locating element 53. Thus the locating element 53 moves along with the pulling member 55. The pulling member 55 can be semicircular or any other shape that is easy for being pulled. Furthermore, the pulling member 55 can be integrated with the main body 51.

Figure 10:
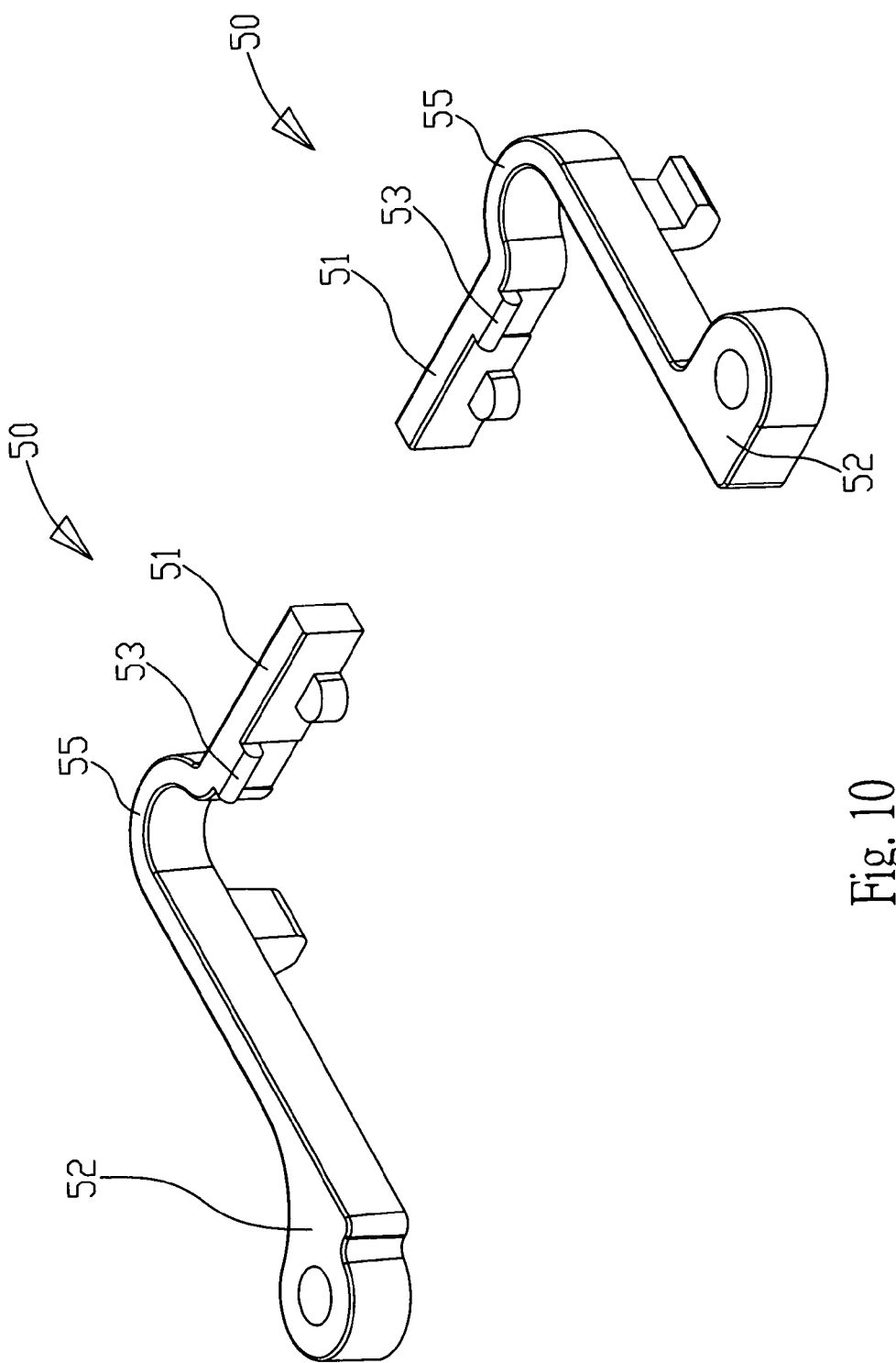
FIG. 10 is a perspective view of a fixing mechanism of a further embodiment in accordance with the present invention.

Refer to FIG. 10, a further embodiment is disclosed. As shown in figure, the difference between this embodiment and above one is in that the main body 51 of this embodiment is separated into two pieces while the above embodiment having the main body 51 disposed with the fixing member 52 and the locating element 53. In this embodiment, the locating element 53 is much more easier to be pulled by the pulling member 55 and the manufacturing cost of the fixing mechanism 50 is saved.

In summary, a fixing mechanism for quick release card in accordance with the present invention includes a main body with fixing members on two ends and a locating element on one side. By the fixing members, the device is disposed on a motherboard while the locating element is used to locate a Mini-PCI card. Therefore, such design avoids malfunction of the card cause by loosening of the card from the socket while plugging the Mini-PCI card into a corresponding slot.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A fixing mechanism for quick release of a card that is applied to a motherboard, comprising:
   an elastic main body having an inner surface portion;
   a pair of fixing members arranged on each end of said elastic main body for being fixed on the motherboard;
   said inner surface portion of said main body extending transversely there between said fixing members;
   an insertion hole formed in said at least one fixing member, said insertion bole corresponding to a fixing hole positioned on the motherboard;
   at least one locking member disposed on the main body;
   at least one locking slot arranged on the motherboard, wherein the locking member fastens with the locking slot: said locking member including a fastening part and the locking slot including a first accommodating slot while the fastening part inserts into the locking slot and locks on the motherboard;
   said locking member further including a connecting part connecting to the main body with the fastening part;
   said locking slot further having a second accommodating slot; said connecting part mounted into the second accommodating slot; and
   at least one locating element disposed on said inner surface of said elastic main body for fixing the card to the motherboard.

2. The fixing mechanism as claimed in claim 1, wherein the elastic body is made from plastic.

3. The fixing mechanism as claimed in claim 1, wherein the fixing member is made from plastic.

4. The fixing mechanism as claimed in claim 1, wherein the locating element is made from plastic.

5. The fixing mechanism as claimed in claim 1, further comprising a screw that inserts through the insertion hole and is threaded into the fixing hole arranged on the motherboard thereby securing said fixing mechanism to the motherboard.

6. The fixing mechanism as claimed in claim 1, wherein at least one supporting member for supporting the card is disposed on one side of the main body, positioned on the same side with the locating element under the locating element.

7. The fixing mechanism as claimed in claim 1, wherein the locking member is L-shaped.

8. The fixing mechanism as claimed in claim 1, wherein the locking slot is L-shaped.

9. The fixing mechanism as claimed in claim 1, wherein the locking member and the main body are integrated with each other.

10. The fixing mechanism as claimed in claim 1, wherein at least one pulling member is disposed on the main body, positioned between the main body and the fixing member, next to the locating element.

11. The fixing mechanism as claimed in claim 10, wherein the pulling member is semicircular.

12. The fixing mechanism as claimed in claim 1, wherein the main body and the fixing member are integrated with each other.

13. The fixing mechanism as claimed in claim 1, wherein the main body and the locating element are integrated with each other.

14. The fixing mechanism as claimed in claim 1, wherein the fixing member and the locating element are integrated with each other.

15. A fixing mechanism for quick release of a card that is applied to a motherboard comprising:

an elastic main body having an inner surface portion;

a pair of fixing members arranged on each end of said elastic main body;

said inner surface portion of said main body extending transversely there between said fixing members;

an insertion hole formed in said at least one fixing member, said insertion hole corresponding to a fixing hole positioned on the motherboard;

at least one locking member disposed on the main body;

at least one locking slot arranged on the motherboard, wherein the locking member fastens with the locking slot; said locking member including a fastening part and the locking slot including a first accommodating slot while the fastening part inserts into the locking slot and locks on the motherboard;

said locking member further including a connecting part connecting to the main body with the fastening part;

said locking slot further having a second accommodating slot; said connecting part mounted into the second accommodating slot; and at least one locating element disposed on said inner surface of said elastic main body, wherein the fixing member is formed from plastic.

* * * * *